United States Patent
Kawakami

(10) Patent No.: US 12,399,224 B2
(45) Date of Patent: *Aug. 26, 2025

(54) BATTERY SYSTEM

(71) Applicant: TOYOTA JIDOSHA KABUSHIKI KAISHA, Toyota (JP)

(72) Inventor: Masatsugu Kawakami, Shizuoka-ken (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/443,436

(22) Filed: Feb. 16, 2024

(65) Prior Publication Data

US 2024/0248143 A1  Jul. 25, 2024

Related U.S. Application Data

(63) Continuation of application No. 18/310,570, filed on May 2, 2023, now abandoned, which is a continuation
(Continued)

(30) Foreign Application Priority Data

Jun. 12, 2020 (JP) .................................. 2020-102252

(51) Int. Cl.
*G01R 31/3842* (2019.01)
*H01M 10/42* (2006.01)
*H01M 10/48* (2006.01)

(52) U.S. Cl.
CPC .... *G01R 31/3842* (2019.01); *H01M 10/4207* (2013.01); *H01M 10/482* (2013.01)

(58) Field of Classification Search
CPC ............. G01R 3/3842; G01R 31/3828; H01M 10/4207; H01M 10/482; H01M 10/44;
(Continued)

(56) References Cited

U.S. PATENT DOCUMENTS 11,680,988 B2   6/2023  Kawakami
11,881,567 B2 * 1/2024  Kawakami .......... H01M 10/486
(Continued)

FOREIGN PATENT DOCUMENTS

CN   103872724 A   6/2014
JP   2011250622 A   12/2011
(Continued)

OTHER PUBLICATIONS

Masatsugu Kawakami, U.S. Appl. No. 17/326,594, filed May 21, 2021.
(Continued)

*Primary Examiner* — Michael P Nghiem
(74) *Attorney, Agent, or Firm* — Dickinson Wright, PLLC

(57) ABSTRACT

A battery system capable of avoiding an over charge with a simple sensor element is provided. The battery system comprises a battery module including a battery pack A including a plurality of battery cells connected in series, and a battery pack B including a plurality of battery cells connected in series, connected in parallel, a monitoring unit configured to monitor a condition of the battery module, and a control unit configured to control at least a charge of the battery module. The monitoring unit includes: a first current sensor to measure a total current $I_A$ of the battery pack A, and a second current sensor to measure a total current $I_B$ of the battery pack B. The control unit calculates a determining value based on the total current $I_A$ and the total current $I_B$, and determines an occurrence of an over charge based on the determining value.

3 Claims, 5 Drawing Sheets

Related U.S. Application Data of application No. 17/326,594, filed on May 21, 2021, now Pat. No. 11,680,988.

(58) Field of Classification Search
CPC .. H01M 10/0525; H01M 10/441; Y02E 60/10
USPC .......................................................... 702/63
See application file for complete search history.

(56) References Cited

U.S. PATENT DOCUMENTS

| | | |
|---|---|---|
| 2013/0140886 A1 | 6/2013 | Bito |
| 2014/0125291 A1 | 5/2014 | Hama et al. |
| 2014/0159666 A1 | 6/2014 | Takeyama |
| 2016/0226263 A1 | 8/2016 | Seo et al. |
| 2016/0240886 A1 | 8/2016 | Yamasaki et al. |
| 2019/0195952 A1* | 6/2019 | Riley .................... G01R 35/00 |
| 2020/0259354 A1 | 8/2020 | Uchida et al. |
| 2021/0391603 A1 | 12/2021 | Kawakami et al. |
| 2023/0266397 A1* | 8/2023 | Kawakami ........ H01M 10/4207 702/63 |

FOREIGN PATENT DOCUMENTS

| | | |
|---|---|---|
| JP | 2012248414 A | 12/2012 |
| JP | 2016080560 A | 5/2016 |
| JP | 2018050400 A | 3/2018 |

OTHER PUBLICATIONS

Masatsugu Kawakami, U.S. Appl. No. 17/326,594, Non-Final Office Action dated Sep. 2, 2022.

Masatsugu Kawakami, U.S. Appl. No. 17/326,594, Notice of Allowance dated Mar. 22, 2023.

Masatsugu Kawakami, U.S. Appl. No. 18/310,570, filed May 2, 2023.

Masatsugu Kawakami, U.S. Appl. No. 18/310,570, Non-Final Office Action dated Nov. 14, 2023.

Masatsugu Kawakami, U.S. Appl. No. 18/310,570, Final Office Action issued on Apr. 15, 2024.

\* cited by examiner

BATTERY SYSTEM

RELATED APPLICATION

This application is a continuation of U.S. patent application Ser. No. 18/310,570, now abandoned, filed May 2, 2023, which is a continuation of U.S. patent application Ser. No. 17/326,594, now U.S. Pat. No. 11,680,988, filed May 21, 2021, which claims priority to Japanese Patent Application No. 2020-102252, filed on Jun. 12, 2020, including the specification, drawings and abstract, the entire disclosure of which is incorporated herein by reference.

TECHNICAL FIELD

The present disclosure relates to a battery system.

BACKGROUND ART

A method for estimating a charging condition of a battery, to protect the battery from an over charge, has been known. For example, Patent Literature 1 discloses a battery pack charging condition estimating device configured to estimate the charging condition of a battery block comprising a plurality of battery cells that estimates the charging condition of the battery cell from the voltage of each battery cell, and the charging condition of the battery block is estimated from the maximum value and the minimum value of the estimated values. This technique addresses to properly calculate the estimated value of the charging condition of the battery pack as a whole.

Also, a technique for preventing an over charge due to circulating current that occurs after the stop of charging, has been know. For example, Patent Literature 2 discloses a method for stopping charge of a power source system comprising a plurality of battery packs provided with a chargeable/dischargeable battery array and a battery monitoring system, and the plurality of the battery packs are connected to each other in series, wherein, when the power source system is charged by supplying electrical power from outside, the charge stopping condition of charging is changed according to either one of the difference of an open circuit voltage and SOC between the plurality of the battery packs.

CITATION LIST

Patent Literatures

Patent Literature 1: Japanese Patent Application Laid-Open (JP-A) No. 2016-080560
Patent Literature 2: JP-A 2018-050400

SUMMARY OF DISCLOSURE

Technical Problem

The voltage per battery cell is measured in Patent Literature 1 in order to estimate respective charging conditions of the plurality of battery cells. In this case, a voltage detecting line is necessary per battery cell so that the sensor element is likely to be complicated.

The present disclosure has been made in view of the above circumstances, and a main object thereof is to provide a battery system capable of avoiding an over charge with a simple sensor element.

Solution to Problem

In order to achieve the object, the present disclosure provides a battery system comprising: a battery module including a battery pack A including a plurality of battery cells connected in series, and a battery pack B including a plurality of battery cells connected in series, connected in parallel, a monitoring unit configured to monitor a condition of the battery module, and a control unit configured to control at least a charge of the battery module, and the monitoring unit includes: a first current sensor configured to measure a total current $I_A$ of the battery pack A, and a second current sensor configured to measure a total current $I_B$ of the battery pack B, and the control unit includes: a calculating section configured to calculate a determining value based on the total current $I_A$ and the total current $I_B$, and a determining section configured to determine an occurrence of an over charge based on the determining value.

According to the present disclosure, a battery system capable of avoiding an over charge with a simple sensor element may be obtained by using the determining value calculated based on the total current $I_A$ and the total current $I_B$.

In the disclosure, the calculating section may calculate a current ratio of the total current $I_A$ and the total current $I_B$ as the determining value, and the determining section may determine the occurrence of the over charge from a condition, wherein the value of the current ratio is a threshold or more, is maintained for a predetermined time.

In the disclosure, the calculating section may calculate a slope of a current ratio of the total current $I_A$ and the total current $I_B$ as the determining value, and the determining section may determine the occurrence of the over charge from a condition, wherein the slope of the current ratio is a threshold or more, is maintained for a predetermined time.

In the disclosure, the predetermined time may be 1 second or more.

In the disclosure, the calculating section may calculate an absolute value of a difference between an integrated value $S_A$ of the total current $I_A$ and an integrated value $S_B$ of the total current $I_B$ as the determining value, and the determining section may determine the occurrence of the over charge from the absolute value being a threshold or more, and a constant increase of both of the integrated value $S_A$ and the integrated value $S_B$ during a period of a base point to the threshold.

In the disclosure, the battery cell in the battery pack A and the battery cell in the battery pack B may be respectively provided with a power generation unit including a cathode layer, an anode layer, and an electrolyte layer formed between the cathode layer and the anode layer, and the electrolyte layer includes an inorganic solid electrolyte.

In the disclosure, the monitoring unit may include no voltage sensor configured to measure a voltage of the battery cell in the battery pack A individually, and may include no voltage sensor configured to measure a voltage of the battery cell in the battery pack B individually.

Advantageous Effects of Disclosure

The battery system in the present disclosure exhibits an effect that an over charge may be avoided with a simple sensor element.

DESCRIPTION OF EMBODIMENTS

A battery system in the present disclosure will be hereinafter described in detail.

Figure 1:
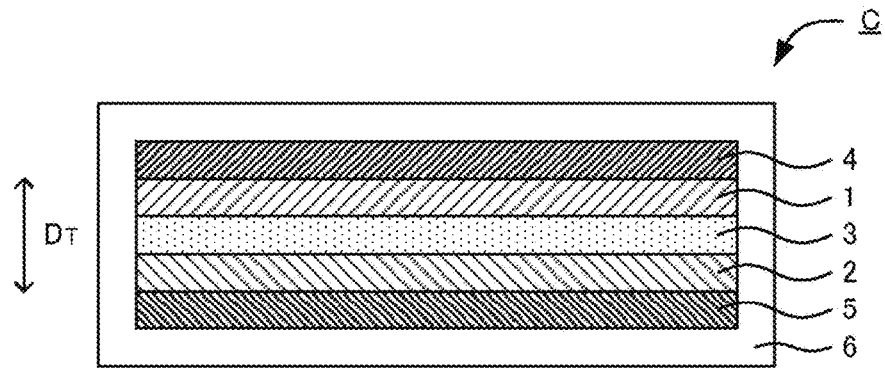
FIG. 1 is a schematic cross-sectional view illustrating an example of a battery cell in the present disclosure.

FIG. 1 is a schematic cross-sectional view illustrating an example of the battery cell in the present disclosure. Battery cell C shown in FIG. 1 includes cathode layer 1, anode layer 2, electrolyte layer 3 formed between cathode layer 1 and anode layer 2, cathode current collector 4 configured to collect currents of cathode layer 1, anode current collector 5 configured to collect currents of anode layer 2, and exterior body 6 configured to store them. Also, in the battery pack in the present disclosure, a plurality of battery cells are connected in series. The plurality of battery cells are preferably placed along the thickness direction (direction $D_T$ in FIG. 1).

Figure 2:
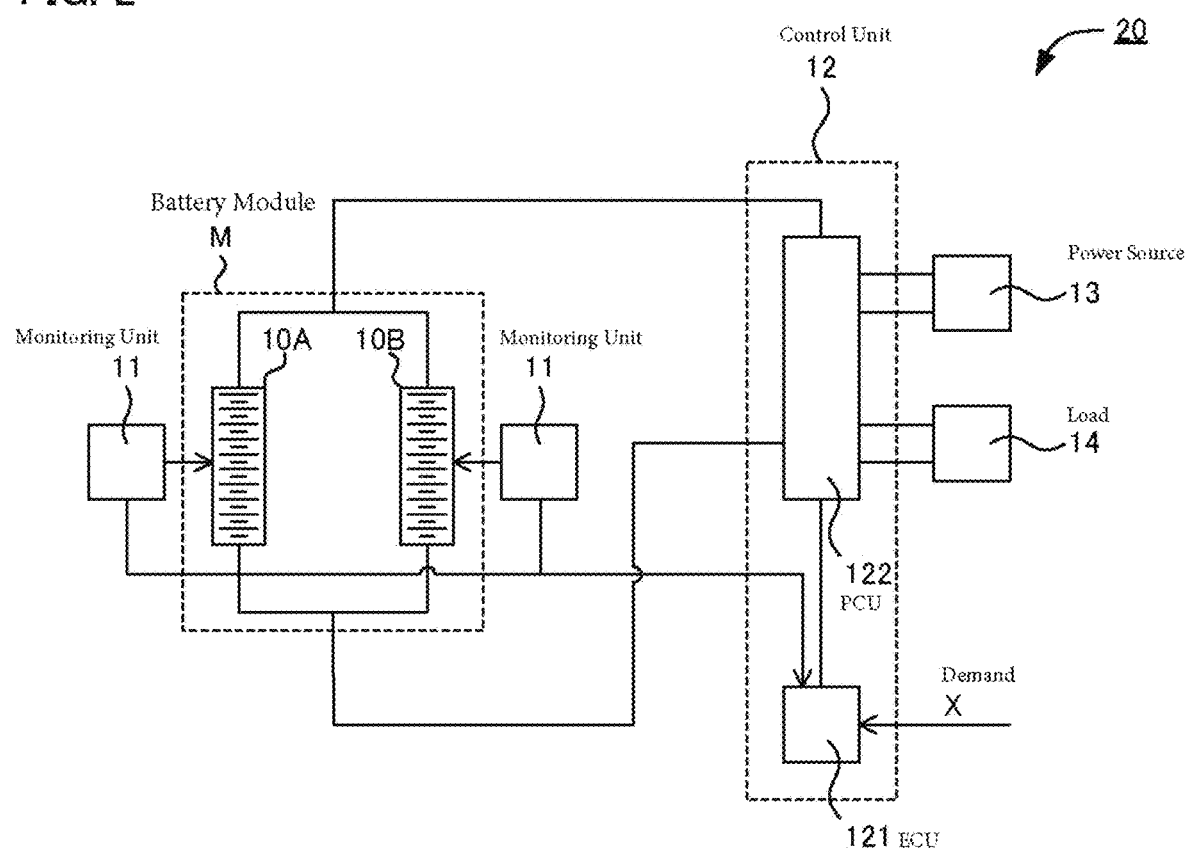
FIG. 2 is a schematic view illustrating a battery system in the present disclosure.

FIG. 2 is a schematic view illustrating a battery system in the present disclosure. Battery system 20 shown in FIG. 2 comprises battery module M including battery pack 10A (battery pack A) including a plurality of battery cells connected in series, and battery pack 10B (battery pack B) including a plurality of battery cells connected in series, connected in parallel. Further, battery system 20 includes monitoring unit 11 configured to monitor the condition of battery pack 10A and battery pack B. Monitoring unit 11 includes a first current sensor configured to measure a total current $I_A$ of battery pack A, and a second current sensor configured to measure a total current $I_B$ of battery pack B.

Also, battery system 20 shown in FIG. 2 includes control unit 12 configured to control the charge and the discharge of battery module M. Control unit 12 includes, for example, ECU (Electronic Control Unit) 121 and PCU (Power Control Unit) 122. ECU 121 instructs (such as start instruction and stop instruction) PCU 122 to charge/discharge based on demand X (such as charge demand and discharge demand) from the outside, and a battery condition (condition of battery pack A and battery pack B) obtained from monitoring unit 11. PCU 122 receives electric power from power source 13 during charge, and supplies electric power to load 14 during discharge. Control unit 12 calculates a determining value based on total current $I_A$ and total current $I_B$, and determines an occurrence of an over charge based on the determining value, and stops the charge.

According to the present disclosure, a battery system capable of avoiding an over charge with a simple sensor element may be obtained by using the determining value calculated based on total current $I_A$ and total current $I_B$. As described above, the voltage per battery cell is measured in Patent Literature 1 in order to estimate respective charging conditions of the plurality of battery cells. In this case, a voltage detecting line is necessary per battery cell so that the sensor element is likely to be complicated. In contrast to this, since there is no need to provide the voltage detecting line per battery cell in the present disclosure, the sensor element may be simplified.

Figure 6:
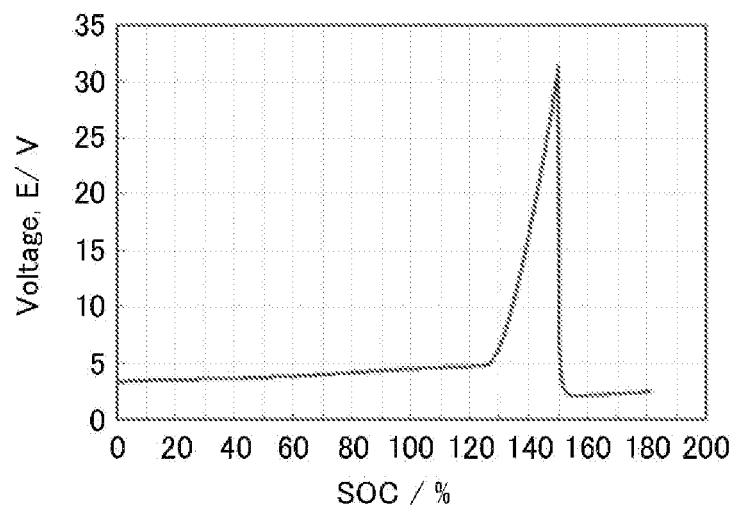
FIG. 6 is a graph showing the result of a charging test to the battery cell in Reference Example.

In the present disclosure, the simplification of the sensor element is realized by focusing on the occurrence of a drastic voltage increase during the over charge, and calculating the change of total current $I_A$ and total current $I_B$ that occurs due to the drastic voltage increase, as the determining value. Specifically, later described FIG. 6 is the result of a charging test to the battery cell using an inorganic solid electrolyte (sulfide solid electrolyte) as the solid electrolyte, and when the SOC (State of Charge) of the battery cell gets higher, the voltage of the battery cell increases drastically. Incidentally, the SOC in FIG. 6 is a value calculated from the integrated value of the total current and the nominal capacity (rated capacity). Also, when a commonly used liquid electrolyte is used, the drastic voltage increased may not be confirmed since an oxidation decomposition of the liquid electrolyte occurs before the drastic increase of the battery cell voltage. However, when a liquid electrolyte with high oxidation decomposition voltage is used, the drastic increase of the voltage is presumed to be confirmed. Also, the reason for the drastic increase of the battery cell voltage is presumed to be the occurrence of an overvoltage.

Also, among the battery cells included in battery pack, examples of the battery cell wherein the over charge is likely to occur may include a battery cell deteriorated over time due to charge/discharge faster. Particularly, a battery cell wherein capacity decrease has occurred due to charge/discharge, is likely to be in an over charged condition during charge. According to the present disclosure, a battery system capable of avoiding an over charge with a simple sensor element may be obtained by using the determining value (a determining value based on the current change due to the drastic voltage increase during the over charge) calculated based on total current $I_A$ and total current $I_B$.

1. Control Unit

The control unit in the present disclosure controls at least a charge of the battery module. Among the above, the control unit preferably controls charge and discharge of the battery module.

The control unit preferably includes ECU configured to determine start, continue and stop of the charge (preferably charge and discharge) based on the battery information obtained from the monitoring unit; and PCU configured to carry out the start, continue and stop of the charge (preferably charge and discharge) of the battery module based on the determination of the ECU.

The ECU is configured to determine the start, continue and stop of the charge (preferably charge and discharge) based on the battery information obtained from the monitoring unit. The ECU usually includes a CPU (Central Processing Unit), a memory, an input/output port configured to input and output various signals. The memory includes, for example, a ROM (Read Only Memory), a RAM (Random Access Memory), and a non-volatile memory that is rewritable. Various determinations are carried out by a program stored in the memory being carried out by CPU.

The ECU includes at least a calculating section, and a determining section as a processing block configured to realize the function. The calculating section is set to calculate a determining value based on total current $I_A$ and total current $I_B$. Also, the determining section preferably obtains total current $I_A$ over time from the first current sensor, and obtains total current $I_B$ over time from the second current sensor. Meanwhile, the determining section is set to determine an occurrence of an over charge based on the determining value calculated by the determining section.

(1) Current Ratio

Figure 3:
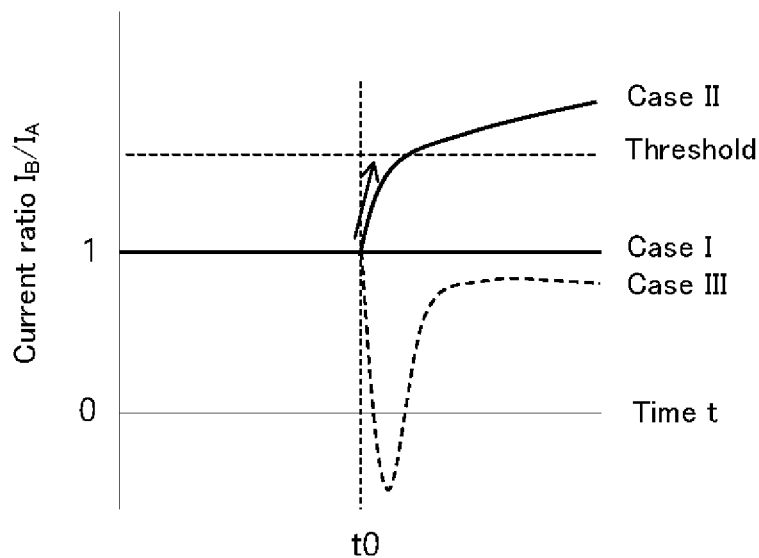
FIG. 3 is a graph explaining a current ratio change over time.

The calculating section may calculate a current ratio of total current $I_A$ and total current $I_B$ as the determining value. In this case, it is preferable that the determining section determines the occurrence of the over charge from a condition, wherein the value of the current ratio is a threshold or more, is maintained for a predetermined time. Here, when battery pack A and battery pack B do not include an abnormal cell (a battery cell wherein the over charge is likely to occur), $I_B/I_A$ is always 1, as shown by Case I in FIG. 3.

Meanwhile, when battery pack A includes an abnormal cell and battery pack B does not include an abnormal cell, since the drastic voltage increase occurs in in the abnormal cell, total current $I_A$ will be lower than total current $I_B$. Therefore, as shown by Case II in FIG. 3, the value of the current ratio ($I_B/I_A$) will be more than 1 at the time over charge occurs t0, after that, the value of the current ratio ($I_B/I_A$) increases over time. Therefore, the occurrence of the over charge may be determined from a condition, wherein the value of the current ratio is a threshold or more, is maintained for a predetermined time.

The threshold of the value of the current ratio is not particularly limited, and is, for example, 1.5 or more, may be 2 or more, and may be 5 or more. Also, the predetermined time is not particularly limited, and is, for example, 1 second or more, may be 5 seconds or more, and may be 1 minute or more. Also, in Case II in FIG. 3, a case wherein battery pack A includes an abnormal cell is assumed. In contrast to this, when a case wherein battery pack B includes an abnormal cell is assumed, the value is $I_B < I_A < 1$ at the time over charge occurs t0. Therefore, the calculating section preferably adopt the higher value as the determining value, among current ratio $I_B/I_A$ and current ratio $I_A/I_B$.

Meanwhile, when battery pack A includes an internally short-circuited cell as the abnormal cell, the voltage of the abnormal cell decreases instantaneously (total current $I_A$ will be higher than total current $I_B$ instantaneously). Specifically, as shown in Case III in FIG. 3, current ratio $I_B/I_A$ decreases instantaneously from the time internal short-circuit occurs t0, and then, recovers to the vicinity of $I_B/I_A=1$. Meanwhile, when assuming current ratio $I_A/I_B$ that is an inverse of current ratio $I_B/I_A$ in Case III in FIG. 3, current ratio $I_A/I_B$ may be the threshold or more for a moment, but such condition is not maintained. Therefore, the occurrence of the over charge and the occurrence of the internal short-circuit may be determined distinctively.

Based on the viewpoint of instantaneous change, the determining section may determine the occurrence of the over charge from the condition that the value of the current ratio is the threshold or more, and that the current ratio is constantly increasing during the period of a base point (first base point) to the threshold, and for a predetermined time since the current ratio reaches the threshold. The first base point is not particularly limited, and is, for example, an arbitrary time that satisfies 1<current ratio<1.5. Also, the preferable predetermined time is similar to those described above.

Also, at occurrence of the internal short-circuit, a sneak current usually occurs. When the value of the sneak current is higher than the value of the charging current, the value of the current ratio will be a negative value as shown by Case III in FIG. 3. Based on this viewpoint, the determining section may determine the occurrence of the over charge from the condition that the value of the current ratio is the threshold or more, and that the current ratio is constantly a positive value during the period of a base point (first base point) to the threshold, and for a predetermined time since the current ratio reaches the threshold. The preferable first base point and the preferably predetermined time are similar to those described above. Incidentally, the above described methods for determining may be used in combination.

(2) Slope of Current Ratio

The calculating section may calculate a slope of a current ratio of total current $I_A$ and total current $I_B$ as the determining value. In this case, the determining section preferably determines the occurrence of the over charge from a condition, wherein the slope of the current ratio is a threshold or more, is maintained for a predetermined time. Here, when battery pack A and battery pack B do not include an abnormal cell (a battery cell wherein the over charge is likely to occur), the slope of $I_B/I_A$ is always 0, as shown by Case I in FIG. 3.

Meanwhile, when battery pack A includes an abnormal cell and battery pack B does not include an abnormal cell, since the drastic voltage increase occurs in the abnormal cell, total current $I_A$ will be lower than total current $I_B$. Therefore, as shown by Case II in FIG. 3, the slope of the current ratio ($I_B/I_A$) will be higher than 0 at the time over charge occurs t0. Therefore, the occurrence of the over charge may be determined from a condition, wherein the slope of the current ratio is a threshold or more, being maintained for a predetermined time. Incidentally, the slope of the current ratio is indicated with, for example, an arrow in FIG. 3.

The threshold of the slope of the current ratio is not particularly limited, when the unit of the time is "second", the threshold is, for example, 0.5 or more, may be 1 or more, and may be 2 or more. The slope of the current ratio may be determined as the amount of the change of the current ratio per unit time (such as 1 second). Also, the predetermined time is not particularly limited, and is, for example, 1 second or more, may be 5 seconds or more, and may be 1 minute or more. Also, in Case II in FIG. 3, a case wherein battery pack A includes an abnormal cell is assumed. In contrast to this, when a case wherein battery pack B includes an abnormal cell is assumed, the value is $I_B < I_A < 1$ at the time over charge occurs t0. Therefore, the calculating section preferably adopt a slope of a higher value as the determining value, among current ratio $I_B/I_A$ and current ratio $I_A/I_B$.

Meanwhile, when battery pack A includes an internally short-circuited cell as the abnormal cell, the voltage of the abnormal cell decreases instantaneously (total current $I_A$ will be higher than total current $I_B$ instantaneously). Specifically, as shown in Case III in FIG. 3, current ratio $I_B/I_A$ decreases instantaneously from the time internal short-circuit occurs t0, and then, recovers to the vicinity of $I_B/I_A=1$. Meanwhile, when assuming current ratio $I_A/I_B$ that is an inverse of current ratio $I_B/I_A$ in Case III in FIG. 3, the slope of current ratio $I_A/I_B$ may be the threshold or more for a moment, but such condition is not maintained. Therefore, the occurrence of the over charge and the occurrence of the internal short-circuit may be determined distinctively.

Based on the viewpoint of instantaneous change, the determining section may determine the occurrence of the over charge from the condition that the slope of the current ratio is the threshold or more, and that the slope of the current ratio is constantly increasing during the period of a base point (second base point) to the threshold, and for a predetermined time since the slope of the current ratio reaches the threshold. The second base point is not particularly limited, and is, for example, an arbitrary time that satisfies 0.01≤slope of the current ratio<0.5, and may be an arbitrary time that satisfies 0.1≤slope of the current ratio<0.5. Also, the preferably predetermined time is similar to those described above.

Also, at occurrence of the internal short-circuit, a sneak current usually occurs. When the value of the sneak current is higher than the value of the charging current, the slope of the current ratio will be, not only a positive value, but also a negative value as shown in Case III in FIG. 3 (strictly, when the curve of Case III is inverted upside down). Based on this viewpoint, the determining section may determine the occurrence of the over charge from the condition that the slope of the current ratio is the threshold or more, and that the slope of the current ratio is constantly a positive value during the period of a base point (second base point) to the threshold, and for a predetermined time since the slope of the current ratio reaches the threshold. The preferable second base point and the preferable predetermined time are similar to those described above. Incidentally, the above described methods for determining may be used in combination.

(3) Difference Between Integrated Current Values

Figure 4:
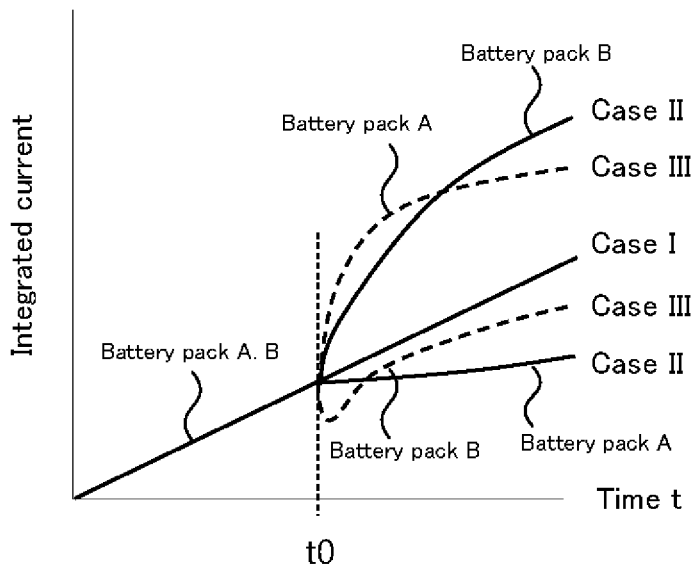
FIG. 4 is a graph explaining an integrated current value change over time.

The calculating section may calculate an absolute value of a difference between an integrated value $S_A$ of total current $I_A$ and an integrated value $S_B$ of total current $I_B$ as the determining value. In this case, the determining section preferably determines the occurrence of the over charge from the absolute value being a threshold or more, and a constant increase of both of integrated value $S_A$ and integrated value $S_B$ during the period of a base point to the threshold. Here, when battery pack A and battery pack B do not include the abnormal cell (a battery cell wherein the over charge is likely to occur), the difference between integrated value $S_A$ of total current $I_A$ and integrated value $S_B$ of total current $I_B$ is 0, as shown in Case I in FIG. 4.

Meanwhile, when battery pack A includes an abnormal cell and battery pack B does not include an abnormal cell, since the drastic voltage increase occurs in in the abnormal cell, total current $I_A$ will be lower than total current $I_B$. Therefore, as shown by Case II in FIG. 4, integrated value $S_A$ of total current $I_A$ will be relatively lower, and integrated value $S_B$ of total current $I_B$ will be relatively higher from the time over charge occurs t0. Therefore, the occurrence of the over charge may be determined in some cases from the difference between the integrated values being a threshold or more. The threshold of the difference between the integrated values (absolute value) is not particularly limited, and when the initial battery capacity is regarded as 100%, the threshold is, for example, 10% or more, may be 20% or more, and may be 50% or more. Incidentally, instead of the initial battery capacity, the battery capacity considering the deterioration due to charge/discharge may be regarded as 100%.

Meanwhile, when battery pack A includes an internally short-circuited cell as the abnormal cell, the voltage of the abnormal cell decreases instantaneously (total current $I_A$ will be higher than total current $I_B$ instantaneously). Specifically, as shown in Case III in FIG. 4, integrated value $S_A$ of total current $I_A$ drastically increases from the time internal short-circuit occurs to. Meanwhile, integrated value $S_B$ of total current $I_B$ temporary decreases due to the sneak current. Therefore, the determining section may determine the occurrence of the over charge from the condition that the difference between the integrated values (absolute value) is the threshold or more, and that the both of integrated value $S_A$ and integrated value $S_B$ are constantly increasing during the period of a base point (third base point) to the threshold. The third base point is not particularly limited, and when the initial battery capacity is regarded as 100%, the third base point is, for example, an arbitrary time that satisfies 3%≤the difference between the integrated values (absolute value) ≤10%, and may be an arbitrary time that satisfies 5%≤the difference between the integrated values (absolute value) ≤10%. Incidentally, instead of the initial battery capacity, the battery capacity considering the deterioration due to charge/discharge may be regarded as 100%. Also, the determining section may further determine the occurrence of the over charge from a condition that the both of integrated value $S_A$ and integrated value $S_B$ are constantly increasing for a predetermined time since the difference between the integrated values (absolute value) reaches the threshold.

(4) Others

The PCU is configure to carry out the start, continue and stop of the charge (preferably charge and discharge) of the battery module based on the determination of the ECU. For the PCU, those similar to a PCU in a usual battery system may be used. Also, the battery system in the present disclosure may include a display unit configured to display a warning when an over charge occurs. Examples of the display unit may include a liquid crystal display.

Figure 5:
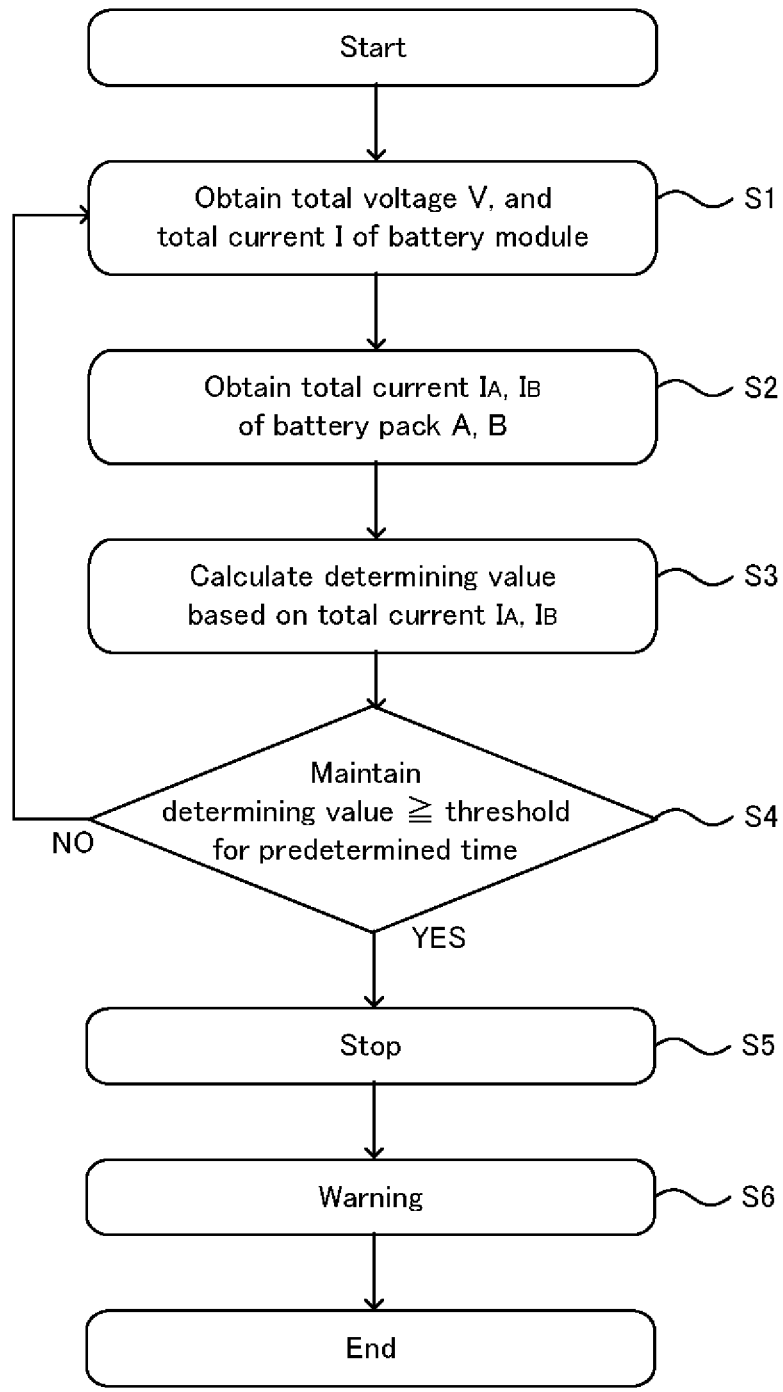
FIG. 5 is a flow chart illustrating processes carried out by a control unit in the present disclosure.

FIG. 5 is a flow chart illustrating processes carried out by a control unit in the present disclosure. In step S1, as shown in FIG. 5, total voltage V, and total current I of a battery module during charge are obtained. In step S2, total current $I_A$ of battery pack A and total current $I_B$ of battery pack B are obtained. In step S3, the above described determination value is calculated based on total current $I_A$ and total current $I_B$. In step S4, the determining value and the threshold previously memorized in the memory are compared, and return to step S1 when a condition wherein the determining value is the threshold or more, is not maintained for a predetermined time. Meanwhile, when the condition wherein the determining value is the threshold or more, is maintained for a predetermined time, it is determined that an over charge has occurred, moved ahead to step S5, and the charging is stopped. In step S6, a warning indicating an over charge is displayed so as to complete the processes.

2. Battery Module

The battery module in the present disclosure includes a battery pack A including a plurality of battery cells connected in series, and a battery pack B including a plurality of battery cells connected in series.

(1) Battery Cell

The battery cell is provided with a power generation unit including a cathode layer, an anode layer, and an electrolyte layer formed between the cathode layer and the anode layer. Further, the battery cell is provided with a cathode current collector configured to collect currents of the cathode layer, and an anode current collector configured to collect currents of the anode layer.

The cathode layer includes at least a cathode active material, and preferably further includes at least one kind of an electrolyte, a conductive material, and a binder, as required. The kind of the cathode active material is not particularly limited, and examples thereof may include an oxide active material. Examples of the oxide active material may include rock salt bed type active materials such as $LiCoO_2$, $LiMnO_2$, $LiNiO_2$, $LiVO_2$, $LiNi_{1/3}Co_{1/3}Mn_{1/3}O_2$; spinel type active materials such as $LiMn_2O_4$, $Li_4Ti_5O_{12}$, and $Li(Ni_{0.5}Mn_{1.5})O_4$; and olivine type active materials such as $LiFePO_4$, $LiMnPO_4$, $LiNiPO_4$, and $LiCoPO_4$.

As the electrolyte to be used for the cathode layer, the material similar to the electrolyte to be used for the electrolyte layer described later may be used. Examples of the conductive material may include carbon materials such as acetylene black (AB), Ketjen black (KB), carbon fiber, carbon nanotube (CNT), and carbon nanofiber (CNF). Examples of the binder may include fluorine-based binders such as polyvinylidene fluoride (PVDF).

The anode layer includes at least an anode active material, and preferably further includes at least one of an electrolyte, a conductive material, and a binder as required. Examples of the anode active material may include carbon active materials such as graphite; and metal active materials such as Si, Sn, In, and Al. The electrolyte, the conductive material, and the binder may be in the same contents as those described for the cathode layer above.

The electrolyte layer includes at least an electrolyte. The electrolyte may be an inorganic solid electrolyte, may be a solid polymer electrolyte, may be an electrolyte solution (liquid electrolyte), and may be a semisolid electrolyte (clay type electrolyte). Among the above, the inorganic solid electrolyte is preferable. The reason therefor is because an oxidation decomposition due to the over charge is not likely to occur. That is, the battery cell in the present disclosure is preferably an all solid state battery cell including a solid electrolyte layer including an inorganic solid electrolyte. The oxidation decomposition voltage of the electrolyte is, for example, 5 V (vs Li/Li$^+$) or more, may be 15 V (vs Li/Li$^+$) or more, and may be 30 V (vs Li/Li$^+$) or more.

Examples of the inorganic solid electrolyte may include sulfide solid electrolyte, oxide solid electrolyte, nitride solid electrolyte, and halide solid electrolyte. Examples of the sulfide solid electrolyte may include solid electrolyte including a Li element, an X element (X is at least one kind of P, As, Sb, Si, Ge, Sn, B, Al, Ga, and In) and a S element. Also, the sulfide solid electrolyte may further include at least either one of an O element and a halogen element. Examples of the halogen element may include a F element, a Cl element, a Br element, and an I element.

The sulfide solid electrolyte may be a glass type solid electrolyte, may be a glass ceramic type solid electrolyte, and may be a crystal type solid electrolyte. Also, the sulfide solid electrolyte may include a crystal phase with high ion conductivity. Examples of the crystal phase may include a Thio-LISICON type crystal phase, a LGPS type crystal phase, and an algirodite type crystal phase.

Examples of the composition of the sulfide solid electrolyte may include $xLi_2S \cdot (1-x)P_2S_5$ ($0.7 \le x \le 0.8$), $yLiI \cdot zLiBr \cdot (100-y-z)Li_3PS_4$ ($0 \le y \le 30$, $0 \le z \le 30$). Other examples of the composition of the sulfide solid electrolyte may include $Li_{4-x}Ge_{1-x}P_xS_4$ (x satisfies $0<x<1$). In this composition, Sb, Si, Sn, B, Al, Ga, In, Ti, Zr, V, and Nb may be used instead of at least one of Ge and P. Also, a part of Li may be substituted with Na, K, Mg, Ca, and Zn. Further, a part of S may be substituted with a halogen (F, Cl, Br, I).

Examples of the oxide solid electrolyte may include solid electrolyte including a Li element, a Y element (Y is at least one kind of Nb, B, Al, Si, P, Ti, Zr, Mo, W, and S) and an O element. Specific examples of the oxide solid electrolyte may include a garnet type solid electrolyte such as $Li_7La_3Zr_2O_{12}$, a perovskite type solid electrolyte such as $(Li, La)TiO_3$, a nasicon type solid electrolyte such as $Li(Al, Ti)(PO_4)_3$. Also, examples of the nitride solid electrolyte may include $Li_3N$. Examples of the halide solid electrolyte may include LiCl, LiI, and LiBr.

A generally used current collector may be used for the cathode current collector and the anode current collector. Also, the kind of the exterior body is not particularly limited, and it may be a laminated type exterior body, and may be a case type exterior body.

The battery cell in the present disclosure may include only one power generation unit of a cathode layer, an electrolyte layer and an anode layer, and may include two or more of them. In the latter case, a plurality of power generation units are preferably placed along the thickness direction. Also, a bipolar structure may be formed with a plurality of the power generation units. Also, the kind of the battery cell is not particularly limited, and is preferably a lithium ion battery.

(2) Battery Pack

The battery module in the present disclosure includes a battery pack A and a battery pack B as the battery pack. The battery pack includes a plurality of battery cells connected in series. The number of the battery cells in the battery pack is usually 2 or more, may be 6 or more, may be 10 or more, and may be 20 or more. Meanwhile, the number of the battery cells in the battery pack is, for example, 1000 or less, and may be 500 or less. The number of the battery cells in battery pack A and the number of the battery cells in battery pack B may be the same, and may be different.

The total voltage (fully charged) of the battery pack is, for example, 5 V or more, may be 10 V or more, may be 30 V or more, and may be 100 V or more. Meanwhile, the total voltage (fully charged) of the battery pack is, for example, 400 V or less. The total voltage (fully charged) of battery pack A and the total voltage (fully charged) of battery pack B may be the same, and may be different.

In the battery module in the present disclosure, only battery pack A and battery pack B may be connected in parallel, and in addition to battery pack A and battery pack B, other battery pack of one or two or more may be connected in parallel.

3. Monitoring Unit

The battery system in the present disclosure is provided with a monitoring unit configured to monitor a condition of battery pack A and battery pack B. Specifically, the monitoring unit includes a first current sensor configured to measure a total current $I_A$ of the battery pack A, and a second current sensor configured to measure a total current $I_B$ of the battery pack B. Incidentally, when the battery module includes other battery pack of one or two or more connected in parallel, in addition to battery pack A and battery pack B, the monitoring unit may include a current sensor configured to measure the total current of the other battery pack respectively. Also, the monitoring unit may include a voltage sensor (total voltage sensor) configured to measure total voltage V of the battery module. A generally used sensor may be used for the current sensor and the voltage sensor respectively.

Meanwhile, the monitoring unit preferably includes no voltage sensor (individual voltage sensor) configured to measure a voltage of the battery cell in battery pack A individually. Similarly, the monitoring unit preferably includes no voltage sensor (individual voltage sensor) configured to measure a voltage of the battery cell in battery pack B individually. The reason therefor is to avoid the complication of the sensor element. Incidentally, when the number of the battery cell in the battery pack is regarded as N ($N \ge 10$) the monitoring unit may include N/10 or less individual voltage sensor for each battery pack. Also, the monitoring unit may include a temperature sensor configured to measure the temperature of battery pack or the battery module.

The present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

Reference Example

<Production of Cathode Structure>

A slurry including a cathode active material ($LiNi_{1/3}Mn_{1/3}Co_{1/3}O_2$), a sulfide solid electrolyte ($Li_2S$—$P_2S_5$), a binder (PVDF) and a conductive material (vapor grown carbon fiber) was prepared. A cathode structure including a cathode current collector and a cathode layer was obtained by coating the surface of a cathode current collector (aluminum foil) with this slurry and drying.

<Production of Anode Structure>

A slurry including an anode active material (graphite), a sulfide solid electrolyte ($Li_2S$—$P_2S_5$), and a binder (PVDF) was prepared. An anode structure including an anode current collector and an anode layer was obtained by coating the surface of an anode current collector (copper foil) with this slurry and drying.

<Production of Solid Electrolyte Layer>

A slurry including a sulfide solid electrolyte ($Li_2S$—$P_2S_5$), and a binder (PVDF) was prepared. A solid electrolyte layer was formed on a transfer foil by coating the surface of the transfer foil (aluminum foil) with this slurry and drying.

<Production of Battery Cell>

The transfer foil was peeled off from the solid electrolyte layer in an inert gas, the cathode structure was placed on one side surface of the solid electrolyte layer, the anode structure was placed on other side surface, and the stack was pressed to obtain a battery cell. The obtained battery cell was charged under the condition of current rate of 2 C. The result is shown in FIG. 6. Incidentally, the closed circuit voltage of 4.41 V (open circuit voltage of 4.35 V) was set as SOC (State of Charge) 100%. As shown in FIG. 6, it was confirmed that a drastic voltage increase occurred in the high SOC region.

Example

Figure 7:
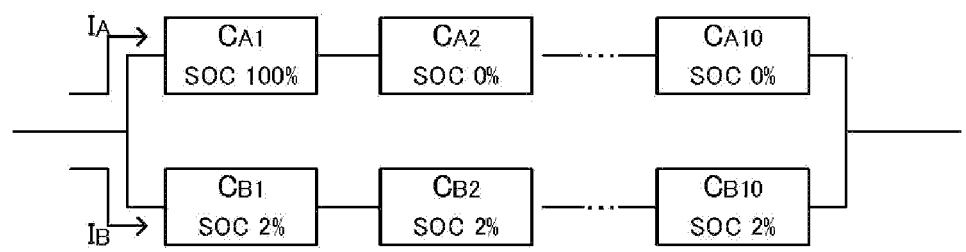
FIG. 7 is a schematic view showing battery pack A and battery pack B in Example.

A battery module as shown in FIG. 7 was produced. Specifically, the battery module was produced by using battery pack A including 10 battery cells ($C_{A1}$ to $C_{A10}$) connected in series, and battery pack B including 10 battery cells ($C_{B1}$ to $C_{B10}$) connected in series. In this battery module, a battery cell wherein SOC was adjusted to 100% was used as battery cell $C_{A1}$, battery cells wherein SOC was adjusted to 0% was used as battery cells $C_{A2}$ to $C_{A10}$, and battery cells wherein SOC was adjusted to 2% was used as battery cells $C_{B1}$ to $C_{B10}$. Each battery cell was produced similarly as Reference Example.

Figure 8:
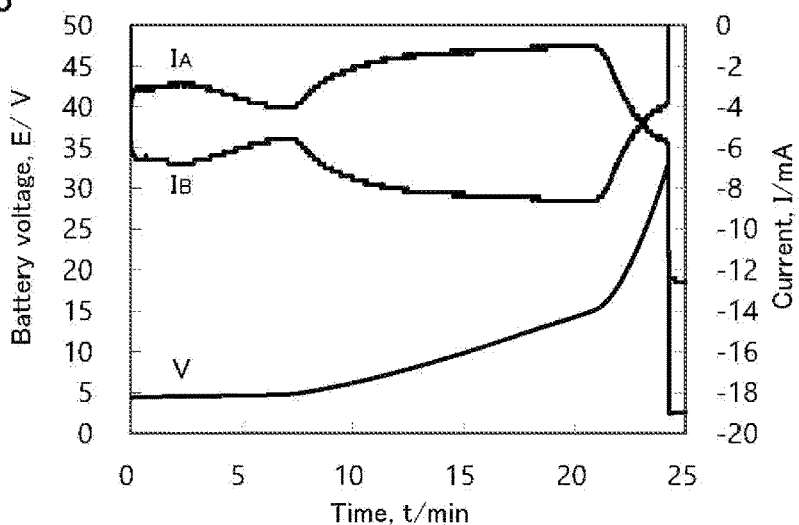
FIG. 8 is a graph explaining changes over time of the total current and the total voltage in Example.
Figure 9:
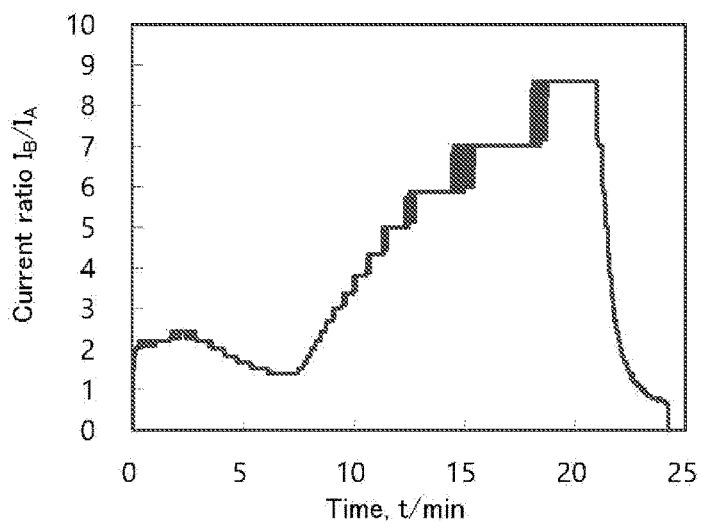
FIG. 9 is a graph explaining a current ratio change over time in Example.
Figure 10:
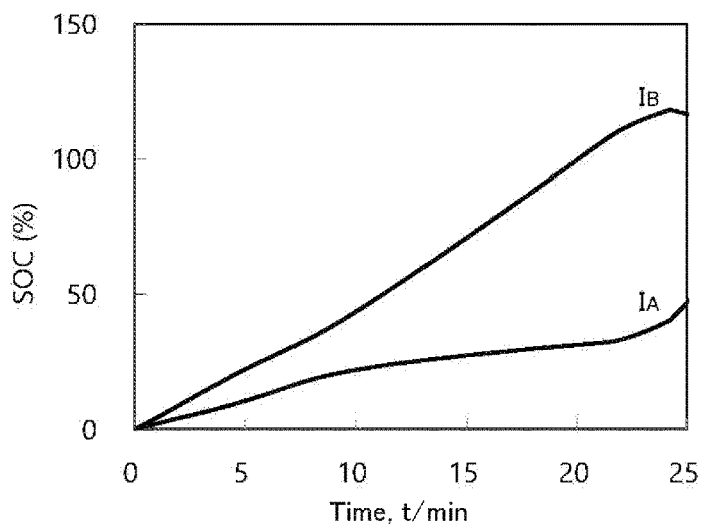
FIG. 10 is a graph explaining an integrated current value (SOC standard) change over time in Example.

The obtained battery module was charged, and total current $I_A$ of battery pack A, total current $I_B$ of battery pack B, total voltage V of the battery module were measured. The results are shown in FIGS. 8 to 10. As shown in FIG. 8, the value of total current $I_A$ was lower than the value total current $I_B$. Incidentally, FIG. 8 shows that the current value is higher in the lower side of the figure, for convenience sake. Also, as shown in FIG. 9, it was confirmed that the value of current ratio $I_B/I_A$ increased along with the charge. Also, as shown in FIG. 10, it was confirmed that the difference between integrated value $S_A$ of total current $I_A$ and integrated value $S_B$ of total current $I_B$ was increased along with the charge. As described above, it was confirmed that the over charge may be avoided by using the determining value (value of current ratio, slope of current ratio, and difference between integrated current values) based on total current $I_A$ and total current $I_B$.

REFERENCE SIGNS LIST

1 . . . cathode layer
2 . . . anode layer
3 . . . electrolyte layer
4 . . . cathode current collector
5 . . . anode current collector
6 . . . exterior body
10 . . . battery pack
11 . . . monitoring unit
12 . . . control unit
13 . . . power source
14 . . . load
20 . . . battery system

What is claimed is:

1. A battery system comprising:
a battery module including a battery pack A including a plurality of battery cells connected in series, and a battery pack B including a plurality of battery cells connected in series, connected in parallel,
a monitoring unit configured to monitor a condition of the battery module, and
a control unit comprising a processor and a memory storing non-transitory computer readable instructions, which instructions are executed by the processor to control at least a charge of the battery module, and
the monitoring unit includes:
a first current sensor configured to measure a total current $I_A$ of the battery pack A, and
a second current sensor configured to measure a total current Is of the battery pack B, and
the control unit is:
configured to calculate a determining value based on the total current $I_A$ and the total current $I_B$, and
configured to determine an occurrence of an over charge based on the determining value;
wherein the control unit calculates a slope of a current ratio of the total current $I_A$ and the total current $I_B$ as the determining value,
the control unit determines the occurrence of the over charge from a condition that the slope of the current ratio is a threshold or more, is maintained for a predetermined time, and
a battery cell in the battery pack A and a battery cell in the battery pack B respectively include a cathode layer, an anode layer, and an electrolyte layer formed between the cathode layer and the anode layer, and the electrolyte layer includes an inorganic solid electrolyte.

2. The battery system according to claim 1, wherein the control unit calculates a current ratio of the total current $I_A$ and the total current Is as the determining value, and
the control unit determines the occurrence of the over charge from a condition, wherein a value of the current ratio is a threshold or more, is maintained for a predetermined time.

3. The battery system according to claim 2, wherein the predetermined time is 1 second or more.

* * * * *